United States Patent
Lau et al.

(10) Patent No.: US 9,534,147 B2
(45) Date of Patent: Jan. 3, 2017

(54) POLISHING COMPOSITION AND METHOD FOR NICKEL-PHOSPHOROUS COATED MEMORY DISKS

(71) Applicant: Cabot Microelectronics Corporation, Aurora, IL (US)

(72) Inventors: Hon Wu Lau, Singapore (SG); Selvaraj Palanisamy Chinnathambi, Singapore (SG); Ke Zhang, Singapore (SG)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 14/515,723

(22) Filed: Oct. 16, 2014

(65) Prior Publication Data

US 2015/0114929 A1   Apr. 30, 2015

Related U.S. Application Data

(60) Provisional application No. 61/892,642, filed on Oct. 18, 2013.

(51) Int. Cl.
| | |
|---|---|
| *C09G 1/02* | (2006.01) |
| *B24B 37/04* | (2012.01) |
| *H01L 21/306* | (2006.01) |
| *G11B 5/84* | (2006.01) |

(52) U.S. Cl.
CPC ............... *C09G 1/02* (2013.01); *B24B 37/044* (2013.01); *G11B 5/8404* (2013.01); *H01L 21/30625* (2013.01)

(58) Field of Classification Search
CPC ............... C09G 1/02; C09G 1/04; C09G 1/16; H01L 21/30625; H01L 21/3212; H01L 2224/13155
See application file for complete search history.

(56) References Cited

U.S. PATENT DOCUMENTS

| | | | |
|---|---|---|---|
| 2,598,213 A | 5/1952 | Blair et al. | |
| 6,093,649 A * | 7/2000 | Roberts et al. | ............... 438/691 |
| 6,159,076 A | 12/2000 | Sun et al. | |
| 6,818,031 B2 | 11/2004 | Oshima | |
| 6,945,851 B2 | 9/2005 | Ward et al. | |
| 7,553,345 B2 | 6/2009 | Kitayama et al. | |
| 8,247,326 B2 | 8/2012 | Balasubramaniam et al. | |
| 8,518,135 B1 * | 8/2013 | Lorpitthaya | .......... B24B 37/044 438/689 |
| 2004/0157535 A1 * | 8/2004 | Chaneyalew et al. | .......... 451/41 |
| 2005/0045852 A1 * | 3/2005 | Ameen et al. | ............... 252/79.1 |
| 2006/0096496 A1 | 5/2006 | Sun et al. | |
| 2008/0026583 A1 * | 1/2008 | Hardy | ................... B24B 37/044 438/693 |
| 2008/0227370 A1 | 9/2008 | Fujii et al. | |
| 2009/0152240 A1 | 6/2009 | de Rege Thesauro et al. | |

FOREIGN PATENT DOCUMENTS

| | | |
|---|---|---|
| WO | 2010090928 A2 | 8/2010 |
| WO | 2010141652 A2 | 12/2010 |

OTHER PUBLICATIONS

Korean Intellectual Property Office As ISA, International Search Report issued in connection with Patent Application No. PCT/US2014/059592 on Jan. 20, 2015.
Brown et al., Optical polishing of metals. Proceedings of the Society of Photo-Optical Instrumentation Engineers, vol. 306, p. 42-57, 1981.

* cited by examiner

*Primary Examiner* — Duy Deo
(74) *Attorney, Agent, or Firm* — Thomas Omholt

(57) ABSTRACT

The invention provides a polishing composition that contains (a) α-alumina particles that have an average particle size of about 250 nm to about 300 nm, (b) a per-type oxidizing agent, (c) a complexing agent, wherein the complexing agent is an amino acid or an organic acid, and (d) water. The invention also provides a method of polishing a substrate, especially a nickel-phosphorous substrate, with the polishing composition.

14 Claims, No Drawings

POLISHING COMPOSITION AND METHOD FOR NICKEL-PHOSPHOROUS COATED MEMORY DISKS

BACKGROUND OF THE INVENTION

The demand for increased storage capacity in memory or rigid disks and the trend towards miniaturization of memory or rigid disks (e.g., due to the requirement for smaller hard drives in computer equipment) continues to emphasize the importance of the memory or rigid disk manufacturing process, including the planarization or polishing of such disks for ensuring maximal performance. While there exist several chemical-mechanical polishing (CMP) compositions and methods for use in conjunction with semiconductor device manufacture, few conventional CMP methods or commercially available CMP compositions are well-suited for the planarization or polishing of memory or rigid disks.

The term "memory or rigid disk" refers to any magnetic disk, hard disk, rigid disk, or memory disk for retaining information in electromagnetic form. The memory or rigid disk typically has a surface that comprises nickel-phosphorous, but the memory or rigid disk surface can comprise any other suitable material. The planarity of the memory or rigid disks must be improved, as the distance between the recording head of a disk drive and the surface of the memory or rigid disk has decreased with improvements in recording density that demand a lower flying height of the magnetic head with respect to the memory or rigid disk. In order to permit a lower flying height of the magnetic head, improvements to the surface finish of the memory or rigid disk are required.

Surface characteristics of memory or rigid disks affecting the flying height of the magnetic head include waviness and microwaviness. Waviness or warp is a gross deviation from flatness over the entire disk surface. An intermediate form of surface deviation, herein referred to as microwaviness, may exist. Microwaviness is a waviness of a disk surface for a range of wavelengths that are on the order of the length of the transducing head. Using current technology, these wavelengths are approximately in the range of 10 to 5000 microns. For low flying head heights, microwaviness can create an airbearing resonance, thereby causing excessive head to disk spacing modulation. The spacing modulation resulting from microwaviness can cause poor overwriting of data on the disk surface, and in some cases can even cause collision of the head with the disk surface with resulting damage to the disk surface and/or the recording head.

During the polishing of a memory or rigid disk, typically the edges of the disk receive a higher pressure from the polishing tool than the remaining surface of the disk, which leads to the formation of a curved, or rounded, contour at the edges of the disk. The rounded edge areas are known in the art as edge roll-off, rub-off, or dub-off. Such rounded areas on a disk are unsuitable for recording. Because of the increased storage requirements of memory or rigid disks, there is a need to utilize as much of the disk as possible, including the extreme edge.

There remains a need in the art for a polishing composition and method for planarizing or polishing memory or rigid disks which improve short frequency microwaviness and extreme radius of curvature edge roll-off, without sacrificing the removal rate of the substrate.

BRIEF SUMMARY OF THE INVENTION

The invention provides a polishing composition comprising α-alumina abrasive particles having an average particle size of about 250 nm to about 300 nm, a per-type oxidizing agent, a complexing agent, wherein the complexing agent is an amino acid or an organic acid, and water.

The invention provides a method of polishing a substrate, which method comprises (i) providing a substrate, especially a substrate comprising at least one layer of nickel-phosphorous, (ii) providing a polishing pad, (iii) providing a polishing composition of the invention, (iv) contacting a surface of the substrate with the polishing pad and the polishing composition, and (v) abrading at least a portion of the surface of the substrate to remove at least some portion of the substrate, especially at least some portion of nickel-phosphorous, from the surface of the substrate and to polish the surface of the substrate.

DETAILED DESCRIPTION OF THE INVENTION

The invention provides a polishing composition comprising, consisting essentially of, or consisting of an abrasive, a per-type oxidizing agent, a complexing agent, wherein the complexing agent is an amino acid or an organic acid, or a combination thereof and water.

The abrasive comprises, consists essentially of, or consists of α-alumina particles that have an average particle size in the range of about 250 nm to about 300 nm. The oxidizing agent comprises, consists essentially of, or consists of a per-type oxidizing agent.

Alpha alumina (α-alumina) particles refer to alumina particles comprising about 50 wt. % or more of the alpha polymorph of alumina, which polymorph typically is formed at high temperatures, e.g., above 1400° C.

The polishing composition comprises at least a first α-alumina abrasive that has an average particle size of about 250 nm to 300 nm, for example 280 nm. The term average particle size is generally known in the art of abrasive particles and refers to the diameter of the smallest sphere that encompasses the particle. For example, the particle size of an approximately spherical particle is the diameter of the particle. The particle size of any non-spherical particle is the diameter of the smallest sphere that encompasses the particle. The average particle size of the abrasive particles can be measured using any suitable technique, for example, using laser diffraction techniques. Suitable particle size measurement instruments are commercially available, such as from Malvern Instruments (Malvern, UK).

The polishing composition can comprise any suitable amount of the first α-alumina abrasive. The polishing composition can contain about 0.01 wt. % or more, about 0.05 wt. % or more, about 0.1 wt. % or more, or about 0.3 wt. % or more of the first α-alumina abrasive. Alternatively, or in addition, the polishing composition can contain about 2 wt. % or less, about 1 wt. % or less, about 0.8 wt. % or less, or about 0.5 wt. % or less of the first α-alumina abrasive. Thus, the polishing composition can contain the first α-alumina abrasive in an amount bounded by any two of the aforementioned endpoints. For example, the polishing composition can contain about 0.01 to about 2 wt. %, about 0.1 to about 1 wt. %, about 0.3 to about 0.8 wt. %, or about 0.1 to about 0.8 wt. % of the first α-alumina abrasive.

The polishing composition may optionally comprise a second α-alumina abrasive that has an average particle size of about 320 nm to 380 nm, for example 350 nm. The polishing composition can comprise any suitable amount of the second α-alumina abrasive. The polishing composition can contain about 0.01 wt. % or more, about 0.05 wt. % or more, about 0.1 wt. % or more, or about 0.3 wt. % or more of the second α-alumina abrasive. Alternatively, or in addition, the polishing composition can contain about 2 wt. % or less, about 1 wt. % or less, about 0.8 wt. % or less, or about 0.5 wt. % or less of the second α-alumina abrasive. Thus, the polishing composition can contain the second α-alumina abrasive in an amount bounded by any two of the aforementioned endpoints. For example the polishing composition can contain about 0.01 to about 2 wt. %, about 0.1 to about 1 wt. %, about 0.3 to about 0.8 wt. %, or about 0.1 to about 0.8 wt. % of the second α-alumina abrasive.

The composition can contain a weight ratio of the first α-alumina abrasive to the second α-alumina abrasive of 1:1 or more, 2:1 or more, 3:1 or more, or 4:1 or more. Compositions having both the first α-alumina abrasive and the second α-alumina abrasive would be considered as having an α-alumina abrasive with a bimodal distribution (i.e., having a first distribution peak at about 250 nm to 300 nm, and a second peak at about 320 nm to 380 nm). In this case, the weight ratio of the abrasive particles in the first distribution peak to the second peak may be 1:1 or more, 2:1 or more, 3:1 or more, or 4:1 or more.

The total concentration of α-alumina abrasive, that is the sum of the first α-alumina abrasive and the second α-alumina abrasive, may be about 0.01 wt. % or more, about 0.05 wt. % or more, about 0.1 wt. % or more, or about 0.3 wt. % or more. Alternatively, or in addition, the polishing composition can contain about 5 wt. % or less, about 3 wt. % or less, about 1 wt. % or less, about 0.8 wt. % or less, or about 0.5 wt. % or less total concentration of α-alumina abrasive. Thus, the polishing composition can contain the total α-alumina abrasive in an amount bounded by any two of the aforementioned endpoints recited for the total α-alumina abrasive concentration. For example the polishing composition can contain about 0.01 to about 5 wt. %, about 0.1 to about 3 wt. %, about 0.3 to about 1.0 wt. %, or about 0.1 to about 0.8 wt. % of the α-alumina abrasive.

The polishing composition optionally comprises fumed alumina abrasive. Fumed alumina has an aggregate structure in which approximately spherical primary particles are associated into chain-like aggregates of primary particles. The primary particles are bonded together by covalent bonds and electrostatic interactions and typically are resistant to degradation by, e.g., mechanical energy inputs such as high-shear mixing. Multiple fumed alumina aggregates can be more loosely associated in the form of agglomerates. Agglomerates are more easily broken up into their component aggregates. The particles size of the fumed alumina refers to the diameter of the smallest sphere that encloses the aggregate of primary particles (rather than individual primary particles or the agglomerates of multiple aggregates).

The fumed alumina abrasive can have any suitable average particle size (i.e., average particle diameter). The fumed alumina abrasive can have an average particle size of about 30 nm or more, about 40 nm or more, about 50 nm or more, about 70 nm or more, or about 100 nm or more. Alternatively, or in addition, the fumed alumina abrasive can have an average particle size of about 250 nm or less, about 230 nm or less, about 210 nm or less, about 190 nm or less, or about 150 nm or less. Thus, the fumed alumina abrasive can have an average particle size bounded by any two of the aforementioned endpoints. For example, the fumed alumina abrasive can have an average particle size of about 30 to about 250 nm, about 30 to about 230 nm, about 50 to about 190 nm, or about 70 to about 150 nm.

The polishing composition can comprise any suitable amount of the fumed alumina abrasive. The polishing composition can contain about 0.01 wt. % or more, about 0.05 wt. % or more, about 0.1 wt. % or more, or about 0.3 wt. % or more of the fumed alumina particles. Alternatively, or in addition, the polishing composition can contain about 1 wt. % or less, about 0.5 wt. % or less, about 0.1 wt. % or less, about 0.08 wt. % or less, or about 0.05 wt. % or less of the fumed alumina abrasive. Thus, the polishing composition can contain the fumed alumina abrasive in an amount bounded by any two of the aforementioned endpoints recited for the fumed alumina particles. For example the polishing composition can contain about 0.01 to about 1 wt. %, about 0.01 to about 0.5 wt. %, or about 0.1 to about 0.3 wt. % of the spherical fumed alumina abrasive, for example 0.175 wt. % or for example 0.24 wt. %.

The polishing composition optionally comprises a wet-process silica abrasive (e.g., condensation-polymerized or precipitated silica particles). Condensation-polymerized silica particles typically are prepared by condensing $Si(OH)_4$ to form colloidal particles, where colloidal particles are defined as having an average particle size between about 1 nm and about 1000 nm. Such wet-process silica particles can be prepared in accordance with U.S. Pat. No. 5,230,833 or can be obtained as any of various commercially available products, such as the Akzo-Nobel Bindzil 50/80 product, the Nalco DVSTS006 product, and the Fuso PL-2 product, as well as other similar products available from DuPont, Bayer, Applied Research, Nissan Chemical, and Clariant.

The wet-process silica abrasive can have any suitable average particle size (i.e., average particle diameter). The wet-process silica abrasive can have an average particle size of about 4 nm or more, about 10 nm or more, about 15 nm or more, about 20 nm or more, or about 25 nm or more. Alternatively, or in addition, the wet-process silica abrasive can have an average particle size of about 180 nm or less, about 120 nm or less, about 110 nm or less, about 100 nm or less, about 90 nm or less, about 80 nm or less, about 70 nm or less, about 60 nm or less, about 50 nm or less, or about 40 nm or less. Thus, the wet-process silica abrasive can have an average particle size bounded by any two of the aforementioned endpoints. For example, the wet-process silica abrasive can have an average particle size of about 10 to about 100 nm, about 20 to about 100 nm, about 20 to about 80 nm, about 20 to about 60 nm, or about 20 to about 40 nm.

The polishing composition can contain any suitable amount of wet-process silica abrasive. The polishing composition can contain about 0.5 wt. % or more, 1 wt. % or more, 2 wt. % or more, or 2.5 wt. % or more of wet-process silica particles. Alternatively, or in addition, the polishing composition can contain about 5 wt. % or less, about 4.5 wt. % or less, about 4 wt. % or less, about 3.5 wt. % or less or about 3 wt. % or less of wet-process silica abrasive. Thus, the polishing composition can contain wet-process silica abrasive in an amount bounded by any two of the aforementioned endpoints. For example the polishing composition can contain about 0.5 to about 5 wt. %, about 1 to about 3.5 wt. %, about 0.5 to about 3.5 wt. %, or about 0.5 to about 3 wt. % of wet-process silica abrasive.

The polishing composition preferably does not contain any other forms of alumina, i.e., alumina particles other than the first and second α-alumina abrasive and the spherical fumed alumina abrasive described herein. Similarly, the polishing composition preferably does not contain any other forms of silica, i.e., silica particles other than the wet-process silica abrasive described herein. Furthermore, the polishing composition preferably does not contain any abrasive other than the alumina and silica particles described herein, i.e., abrasive particles other than the first and second α-alumina abrasives, spherical fumed alumina abrasive, and wet-process silica abrasive as described herein.

Preferably, the abrasive is colloidally stable within the polishing composition. The term colloid refers to the suspension of particles in the liquid carrier (e.g., water). Colloidal stability refers to the maintenance of that suspension through time. In the context of this invention, the abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The polishing composition comprises an aqueous carrier, for example, water. The aqueous carrier is used to facilitate the application of the abrasive particles to the surface of a suitable substrate to be polished or planarized. Preferably, the aqueous carrier is water, and the water is preferably deionized water.

The polishing composition can have any suitable pH. The polishing composition desirably has an acidic pH, i.e., a pH of less than 7. Preferably, the polishing composition has a pH of 6 or less (e.g., 5 or less). Preferably the polishing composition has a pH greater than about 1 and less than about 6. Even more preferably, the polishing composition has a pH of about 1 to about 4 (e.g., about 2 to about 4, or about 2 to about 3, or about 3 to about 4).

The polishing composition optionally contains pH adjusting agents, for example, potassium hydroxide, ammonium hydroxide, and/or nitric acid. The polishing composition also optionally comprises pH buffering systems. Many such pH buffering systems are well known in the art. The pH buffering agent can be any suitable buffering agent, for example, bicarbonate-carbonate buffer systems, aminoalkylsulfonic acids, and the like. The polishing composition can comprise any suitable amount of a pH adjustor and/or a pH buffering agent, provided that a suitable amount is used to achieve and/or maintain the pH of the polishing composition within a suitable range.

The polishing composition further comprises at least one per-type oxidizing agent. The function of the oxidizing agent is to oxidize at least a part of a substrate, such as a layer or layers comprising, for example, nickel-phosphorous. The per-type oxidizing agent can be any suitable per-type oxidizing agent. Non-limiting examples include peroxides, persulfates, and periodates. Suitable oxidizing agents include hydrogen peroxide, sodium persulfate salts, periodic acid and ammonium persulfate, and combinations thereof. Preferably, the oxidizing agent is hydrogen peroxide or sodium persulfate.

The polishing composition can contain any suitable amount of the per-type oxidizing agent. The polishing composition can contain 0.01 wt. % or more, 0.5 wt. % or more, 0.1 wt. % or more, 1 wt. % or more, or 1.5 wt. % or more of the oxidizing agent. Alternatively, or in addition, the polishing composition can contain 10 wt. % or less, 5 wt. % or less, 3 wt. % or less, 2 wt. % or less, or 1.5 wt. % or less of the oxidizing agent. Thus, the polishing composition can contain the oxidizing agent in an amount bounded by any two of the aforementioned endpoints. For example, the polishing composition can contain in an amount of 0.01-10 wt. %, 0.5-5 wt. %, 0.1-3 wt. %, 1.5-3 wt. %, or 1-2 wt. % of the oxidizing agent.

The polishing composition further comprises at least one complexing agent for nickel. The complexing agents include amino acid type complexing agents and organic carboxylic acids. Any suitable amino acid type or carboxylic acid type complexing agent may be used. Examples of useful amino acids may include glycine, aspartic acid, N-(hydroxyethyl) ethylenediaminetriacetic acid, histidine, lysine, alanine, serine, phenylalanine, glutamine, picolinic acid and nitrilotriacetic acid. Examples of useful carboxylic acids may include citric acid, malic acid, malonic acid, acetic acid, oxalic acid, nicotinic acid alipic acid, glutaric acid, gluconic acid, glycolic acid, phthalic acid, maleic acid, adipic acid, fumaric acid, ethylenediaminediaminetetraacetic acid (EDTA) and tartaric acid.

The polishing composition can contain any suitable amount of the complexing agent. The polishing composition can contain 0.01 wt. % or more, 0.5 wt. % or more, 0.1 wt. % or more, 1 wt. % or more, or 1.5 wt. % or more of the complexing agent. Alternatively, or in addition, the polishing composition can contain 10 wt. % or less, 5 wt. % or less, 3 wt. % or less, 2 wt. % or less, or 1.5 wt. % or less of the complexing agent. Thus, the polishing composition can contain the complexing agent in an amount bounded by any two of the aforementioned endpoints. For example, the polishing composition can contain in an amount of 0.01-10 wt. %, 0.5-5 wt. %, 0.1-3 wt. %, 1.5-3 wt. %, or 1.5-2 wt. % of the complexing agent.

The polishing composition, optionally, further comprises at least one basic amine. Any suitable basic amine may be used. For example, suitable basic amines may include benzylamine, ethylenediamine, tetraethylenepentamine and triethanolamine.

The polishing composition can contain any suitable amount of the basic amine. The polishing composition can contain 0.01 wt. % or more, 0.05 wt. % or more, 0.1 wt. % or more, 0.5 wt. % or more, or 1 wt. % or more of the nonionic surfactant. Alternatively, or in addition, the polishing composition can contain 5 wt. % or less, 3 wt. % or less, 2 wt. % or less, or 1.5 wt. % or less of the nonionic surfactant. Thus, the polishing composition can contain the nonionic surfactant in an amount bounded by any two of the aforementioned endpoints. For example, the polishing composition can contain in an amount of 0.01-5 wt. %, 0.05 to 1.5 wt. %, 0.05-3 wt. %, 0.1-2 wt. %, 0.5-2 wt. %, or 0.1-1.5 wt. % of the nonionic surfactant.

The polishing composition, optionally, further comprises at least one surfactant surfactant can be any suitable surfactant. Suitable surfactants include copolymer surfactants comprising siloxane units, ethylene oxide units, and/or propylene oxide units which can have a linear, pendant, or trisiloxane structure. Non-limiting examples of suitable nonionic surfactants include alkylphenol ethoxylates (e.g., nonylphenol ethoxylates), alcohol ethoxylates, siloxane ethoxylates, and the like. Preferably, the nonionic surfactant includes nonylphenol ethoxylates such as the Tergitol NP series available from Dow Corning (Midland, Mich.) and siloxane ethoxylates such as the Silwet series available from General Electric (Schenectady, N.Y.).

The polishing composition can contain any suitable amount of the nonionic surfactant. The polishing composition can contain 0.01 wt. % or more, 0.5 wt. % or more, 0.1 wt. % or more, 1 wt. % or more, or 1.5 wt. % or more of the nonionic surfactant. Alternatively, or in addition, the polishing composition can contain 10 wt. % or less, 5 wt. % or less, 3 wt. % or less, 2 wt. % or less, or 1.5 wt. % or less of the nonionic surfactant. Thus, the polishing composition can contain the nonionic surfactant in an amount bounded by any two of the aforementioned endpoints. For example, the polishing composition can contain in an amount of 0.01-10 wt. %, 0.5-5 wt. %, 0.1-3 wt. %, 1.5-3 wt. %, or 1.5-2 wt. % of the nonionic surfactant.

The polishing composition, optionally, further comprises one or more other additives. Such additives include metal ions, water soluble polymers, surfactants and/or rheological control agents, antifoaming agents, and biocides. Metal ions may include for example $Fe^{3+}$, $Co^{2+}$, $Cu^{2+}$, $Eu^{3+}$, $Mn^{2+}$, $W^{6+}$, $Mo^{5+}$, $Re^{7+}$ and $Ir^{3+}$. Water soluble polymers may include, for example, polyethylene glycols, anionic polymers or nonionic polymers, and combinations thereof. Additives can be present in the polishing composition at any suitable concentrations. Such additives can include any suitable dispersing agent, such as, for example, homopolymers or random, block, or gradient acrylate copolymers comprising one or more acrylic monomers (e.g., polyacrylates, polymethacrylates, vinyl acrylates and styrene acrylates), combinations thereof, and salts thereof. The biocide can be any suitable biocide, for example, an isothiazolinone biocide.

The polishing composition of the invention can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., first alpha alumina particles, fumed alumina particles, abrasive, water, etc.) as well as any combination of ingredients (e.g., abrasive, water, oxidizing agent, chelating agent, etc.).

For example, the abrasive, or abrasives, can be dispersed in water. The oxidizing agent and complexing agent can then be added, and mixed by any method that is capable of incorporating the components into the polishing composition. Other compounds, describe above, can also be utilized in the preparation of the polishing composition. Optionally, the polishing composition can be prepared prior to use, with one or more components, such as a pH adjusting component, added to the polishing composition just before use (e.g., within about 7 days before use, or within about 1 hour before use, or within about 1 minute before use). The polishing composition also can be prepared by mixing the components at the surface of the substrate during the polishing operation.

The polishing composition also can be provided as a concentrate which is intended to be diluted with an appropriate amount of water prior to use. In such case, the polishing composition concentrate can comprise, for example, abrasive and water in amounts such that, upon dilution of the concentrate with an appropriate amount of water, each component of the polishing composition will be present in the polishing composition in an amount within the appropriate range recited above for each component. Furthermore, as will be understood by those of ordinary skill in the art, the concentrate can contain an appropriate fraction of the water present in the final polishing composition in order to ensure that the components and other suitable additives are at least partially or fully dissolved in the concentrate.

The invention provides a method of polishing a substrate, which method comprises (i) providing a substrate, such as a substrate comprising at least one layer of nickel-phosphorous, (ii) providing a polishing pad, (iii) providing a polishing composition as described herein, (iv) contacting a surface of the substrate with the polishing pad and the polishing composition, and (v) abrading at least a portion of the surface of the substrate to remove at least some portion of the surface of the substrate, such as to remove at least some nickel-phosphorous from the surface of the substrate, and to polish the surface of the substrate.

The polishing method of the invention is particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be polished with the polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, conformed products thereof, and mixtures thereof. Soft polyurethane polishing pads are particularly useful in conjunction with the inventive polishing method.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a substrate being polished enables the determination of the polishing end-point, i.e., the determination of when to terminate the polishing process with respect to a particular substrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the situation where more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately, or shortly before delivery to the point-of-use.

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing composition are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention also provides methods of polishing a substrate with the polishing compositions described herein. The methods of polishing a substrate comprise (i) providing a substrate; (ii) providing a polishing pad; (iii) providing an aforementioned chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

EXAMPLES

The following examples further illustrate the invention but, of course, should not be construed as in any way limiting its scope.

Example 1

This example demonstrates the effect of the polishing compositions of the present invention on μWa-short and XRCE when compared to control compositions. Nickel phosphate (NiP) wafers having a composition of 12% phosphate and 88% nickel were polished with various polishing compositions using a Strasbaugh 6EE Double Surface Polishmeter (Strasbaugh, San Luis Obispo, Calif.). Fifteen wafers were polished for each treatment. Removal rates were determined by sampling 5 wafers and measuring the weight differential before and after polishing. Removal rates are expressed as mg removed/minute. The short frequency microwaviness (μWa-short) and extreme radius of curvature roll-off (XRCE) measurements were taken at 80-500 μm using a Zygo Newview 100 (Zygo, Middlefield, Conn.) by taking 3 wafers from each treatment and measuring them at 120° 240° and 360° (0°) from a point of origin of the wafer, respectively. Both the top and the bottom of the wafers were measured in each location. The remaining 2 wafers were retained for back up purposes.

All of the treatments had α-alumina (average particle size of 280 nm or 320 nm), 0.8 wt. % tartaric acid, and 1.2 wt. % of hydrogen peroxide. The control slurry (1) consisted of 0.7 wt. % α-alumina (average particle size of 320 nm), 0.18 wt. % fumed alumina (SA), 2.63 wt. % colloidal silica (CS), at pH 2.3. The inventive treatments had components and amounts as listed in Table 1.

TABLE 1

| Trmt No. | α-Alumina Size (nm) | α-Alumina wt % | Fumed Alumina (SA) wt % | Colloidal Silica (CS) wt % | pH | RR (mg/min) | μWa-short (nm) | XRCE (nm) |
|---|---|---|---|---|---|---|---|---|
| 1 | 350 | 0.7 | 0.18 | 2.63 | 2.3 | 38.41 | 3.24 | 82.07 |
| 2 | 280 | 0.7 | 0.18 | 2.63 | 2.3 | 30.45 | 2.55 | 83.82 |
| 3 | 280 | 1.0 | 0.25 | 2.63 | 2.3 | 29.81 | 2.71 | 90.92 |
| 4 | 280 | 0.4 | 0.1 | 2.63 | 2.3 | 23.85 | 2.37 | 93.90 |
| 5 | 280 | 0.7 | 0.18 | 2.63 | 1.8 | 35.06 | 2.51 | 96.20 |
| 6 | 280 | 0.7 | 0.18 | 2.63 | 1.3 | 33.92 | 2.66 | 95.31 |
| 1 | 350 | 0.7 | 0.18 | 2.63 | 2.3 | 36.37 | 3.08 | 81.71 |

The results show that the inventive compositions having 280 inn α-alumina are capable of achieving similar removal rates, but with a 20% improvement in μWa-short, when compared to the control compositions having 350 nm α-alumina as the abrasive.

Example 2

This example demonstrates the effects of the compositions of the present invention on removal rate (RR), μWa-short and XRCE, as compared to control compositions. Nickel phosphate (NiP) wafers having a composition of 12% phosphate and 88% nickel were polished under similar conditions as described in Example 1. In this example the control (1) consisted of 0.70 wt. % of α-alumina, 0.18 wt. % fumed alumina, 2.63 wt. % of colloidal silica, 1.20 wt. % of hydrogen peroxide and 0.8 wt. % of tartaric acid. All inventive treatments had 0.18 wt. % of fumed alumina, 1.63 wt. % colloidal silica, 1.60 wt. % of sodium persulfate (SPS), 1.6 wt. % glycine and varying amounts of (hydroxyethyl) ethylene diamine triacetic acid (HEDTA) and ethylene diamine (EDA), in addition to the components shown in Table 2.

TABLE 2

| Trmt No. | 280 nm α-Al₂O₃ (%) | 350 nm α-Al₂O₃ (%) | α-Al₂O₃ wt % | Oxidizer | Oxidizer wt % | H-EDTA (%) | EDA (%) | RR (mg/min) | µWa-short (nm) | XRCE (nm) |
|---|---|---|---|---|---|---|---|---|---|---|
| 1 | — | 100 | 0.70 | H₂O₂ | 1.20 | — | — | 36.41 | 3.19 | 99.67 |
| 2 | 50 | 50 | 0.96 | SPS | 1.60 | 0.5 | — | 34.22 | 3.07 | 60.52 |
| 3 | 80 | 20 | 0.96 | SPS | 1.60 | — | — | 33.00 | 2.92 | 62.29 |
| 4 | 100 | — | 0.96 | SPS | 1.60 | — | — | 26.10 | 2.53 | 64.31 |
| 5 | 80 | 20 | 0.96 | SPS | 1.60 | 0.5 | — | 32.65 | 2.83 | 54.20 |
| 6 | 80 | 20 | 0.96 | SPS | 1.60 | 1 | — | 24.19 | 2.51 | 95.18 |
| 7 | 80 | 20 | 0.96 | SPS | 1.60 | 0.5 | 0.2 | 33.56 | 2.72 | 65.04 |
| 8 | 80 | 20 | 0.96 | SPS | 1.60 | 0.5 | 0.5 | 30.57 | 2.68 | 61.11 |
| 1 | — | 100 | 0.70 | H₂O₂ | 1.20 | — | — | 33.06 | 3.12 | 97.43 |

The results show that all inventive treatments showed improved µWa-short and XRCE results. The use of larger α-alumina particles (350 nm) only gave increased removal rates, but generally did not exhibit as dramatic results for µWa-short and XRCE when compared to inventive treatments with 280 nm α-alumina alone or in combination with the larger α-alumina particles.

Example 3

This example illustrates the specificity of carboxylic acid complexing agents for hydrogen peroxide when compared to sodium persulfate as the oxidizer. Nickel phosphate (NiP) wafers having a composition of 12% phosphate and 88% nickel were polished under similar conditions as described in Example 1. The polishing compositions are shown in Table 3, and included 350 nm α-alumina, fumed alumina (SA), and colloidal silica (CS). When polishing compositions having 1.30 wt. % tartaric acid as the complexing agent and 1.20 wt. % hydrogen peroxide as the oxidizer were used to polish the substrate, removal rates of about 33 mg/minute were observed. By contrast, when similar polishing compositions having 1.30 wt. % tartaric acid as the complexing agent, but having 1.60 wt. % sodium persulfate as the oxidizer were used to polish the substrate, a removal rate of only 7.21 mg/minute were observed.

The results indicate that there is a significant decrease in removal rate when using sodium persulfate with a carboxylic acid type complexing agent, as compared to using a peroxide as the oxidizing agent. Therefore, when using a persulfate oxidizing agent, only the amine complexing agents may be used.

TABLE 3

| Sample No. | Carboxylic Acid (CA) Type | CA wt % | pKa | Oxidizer | Oxidizer wt % | 350 nm α-Al₂O₃ wt % | SA wt % | CS wt % | RR (mg/min) |
|---|---|---|---|---|---|---|---|---|---|
| Control | Tartaric Acid | 1.30 | 2.95 | H₂O₂ | 1.20 | 0.70 | 0.18 | 2.63 | 32.75 |
| I | Tartaric Acid | 1.30 | 2.95 | SPS | 1.60 | 0.96 | 0.24 | 1.63 | 7.21 |
| Control | Tartaric Acid | 1.30 | 2.95 | H₂O₂ | 1.20 | 0.70 | 0.18 | 2.63 | 33.62 |

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) α-alumina abrasive particles having an average particle size of about 250 nm to about 300 nm,
   (b) sodium persulfate,
   (c) a complexing agent, wherein the complexing agent is an amino acid, wherein the amino acid is selected from the group consisting of (hydroxyethyl) ethylene diamine, glycine, and a combination thereof, and
   (d) water, and wherein the composition further comprises an amine, wherein the amine is selected from the group consisting of ethylenediamine, triethanolamine, benzylamine, monoethanolamine, and combinations thereof.

2. The composition of claim 1, further comprising an abrasive selected from the group consisting of substantially spherical alumina particles, colloidal silica particles and combinations thereof.

3. The composition of claim 1, further comprising α-alumina abrasive particles having an average particle size of about 310 nm to about 390 nm.

4. The composition of claim 1, wherein the α-alumina particles comprise 0.1 to 1.0 wt. %.

5. The composition of claim 2, wherein the substantially spherical alumina particles comprise 0.125 wt. % to 0.25 wt. % and the colloidal silica particles comprise 0.15 wt. % to 3.15 wt. %.

6. The composition of claim 3, wherein the weight ratio of the α-alumina abrasive particles having an average particle size of about 250 nm to about 300 nm to the α-alumina abrasive particles having an average particle size of about 310 nm to about 390 nm is 4:1.

7. The composition of claim 1, wherein the amine is ethylenediamine.

8. The composition of claim 1, wherein the complexing agent is (hydroxyethyl) ethylenediamine triacetic acid.

9. A method of polishing a substrate, which method comprises:
   (i) providing a substrate,
   (ii) providing a polishing pad,
   (iii) providing a polishing composition comprising:
      (a) α-alumina abrasive particles having an average particle size of about 250 nm to about 300 nm,
      (b) sodium persulfate
      (c) a complexing agent, wherein the complexing agent is an amino acid, wherein the amino acid is selected from the group consisting of (hydroxyethyl) ethylene diamine, glycine, and a combination thereof, and
      (d) water, wherein the pH of the polishing composition is about 1.3 to about 3.0, and wherein the composition further comprises an amine, wherein the amine is selected from the group consisting of ethylenediamine, triethanolamine, benzylamine, monoethanolamine, and combinations thereof,
   (iv) contacting a surface of the substrate with the polishing pad and the polishing composition, and
   (v) abrading at least a portion of the surface of the substrate to remove at least some portion of the substrate and to polish the surface of the substrate.

10. The method of claim 9, wherein the substrate comprises nickel phosphate.

11. The method of claim 9, wherein the composition further comprises a nonionic surfactant.

12. The method of claim 9, wherein the substrate comprises at least one layer of nickel-phosphorous, and at least some nickel-phosphorous is removed from the surface of the substrate to polish the surface of the substrate.

13. The method of claim 9, wherein the substrate is a nickel-phosphorous coated aluminum memory disk.

14. The method of claim 9, wherein the complexing agent is (hydroxyethyl) ethylenediamine triacetic acid.

* * * * *